United States Patent [19]

Kellogg et al.

[11] 4,393,501

[45] Jul. 12, 1983

[54] LINE PROTOCOL FOR COMMUNICATION SYSTEM

[75] Inventors: Richard A. Kellogg, Syracuse; John B. May, Liverpool; Brian C. Johnson, Syracuse, all of N.Y.

[73] Assignee: General Electric Company, Somersworth, N.H.

[21] Appl. No.: 238,205

[22] Filed: Feb. 26, 1981

[51] Int. Cl.³ .............................................. G06F 11/10
[52] U.S. Cl. ..................................... 371/33; 364/200
[58] Field of Search .................... 371/33, 22; 364/200, 364/900

[56] References Cited

U.S. PATENT DOCUMENTS 3,541,523  11/1970  Bidlack et al. ................... 364/900
3,754,211   8/1973  Rocher et al. .................... 371/33
4,270,205   5/1981  DeShon ......................... 371/33 X Primary Examiner—David H. Malzahn
Attorney, Agent, or Firm—Robert E. Brunson

[57] ABSTRACT

In a communication system, a line protocol format with a variable bit rate and low bit overhead provides for the high integrity, synchronous exchange of digital signal information between master and slave processing units, with master processing unit controlling the line protocol.

10 Claims, 13 Drawing Figures

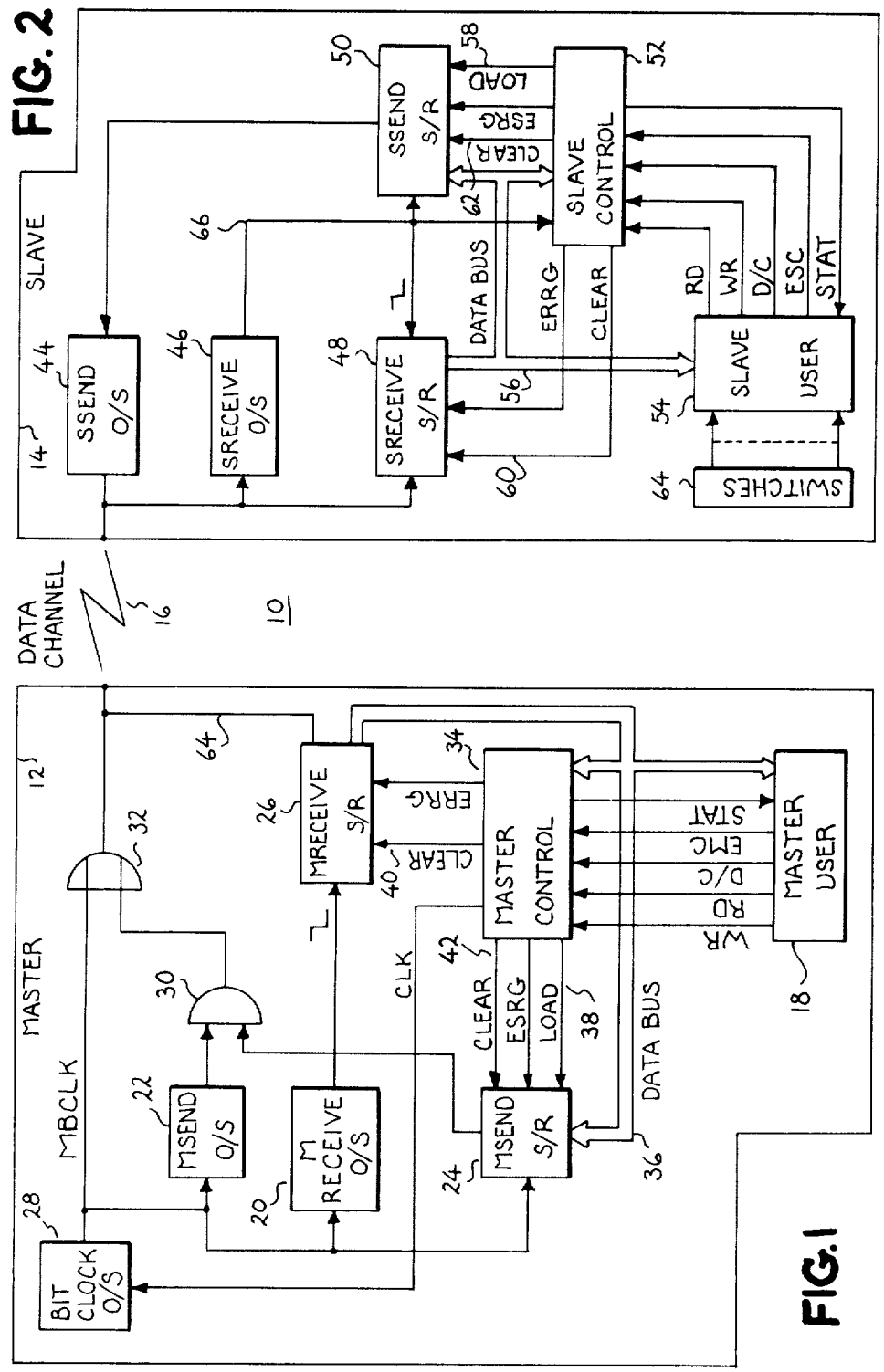

TO FIG. 4B

LINE PROTOCOL FOR COMMUNICATION SYSTEM

BACKGROUND OF THE INVENTION

1. Field of the Invention

This invention relates generally to a communication network line protocol, and more particularly to a data channel or line protocol for providing the exchange of serialized digital signal information between electronic processing units.

2. Description of the Prior Art

There are many applications where it is either desirable, or necessary to serially communicate digital information between electronic devices over a single communication channel. The type of coupling for such a communication channel can be either light, magnetic, RF carrier, or electrical. Regardless of the type of coupling used, the communication link or line protocol plays a very important and determinate role in the overall system equipment design.

There are many well known serial line protocols for controlling the transfer of digital signal information between electronic data processing units. These line protocols are required to organize the transfer of data from one processing unit to another in a manner which assures correct sequening and data integrity. All known types of serial line protocols each have particular characteristics and advantages related to the type of interface over which data is transferred, i.e. single or dual channel, full or half-duplex, synchronous or asynchronous, etc.

All known serial line protocols have a common characteristic, each requires a significant number of dedicated, overhead signal bits within the data or message format (i.e. signal bits that are required for use other than for the transfer of data or message information). These bits are required to ensure the accuracy of the data transmitted in the information field of a message block. Typical overhead bits in a message block comprise the header filled positions (start flag, address field and control field) and trailer field (frame checking and stop flag). Each field (header and trailer) may comprise twenty-four bits for a total of forty-eight bits in each frame. These dedicated signal bits are an overhead cost in the transmission of data under the particular line protocol format since they require some portion of the line utilization time period which may otherwise be used for the transfer of data. This results in some degree of loss in throughput efficiency of the line.

The above discussed overhead bits become particularly undesirable in communication systems where relatively short message lengths (eg. one hundred or less bits per message unit) are interspersed with relatively long pause intervals between the messages or even between the data bits of a message. In this type of communication system, the required protocol format is essentially a link control format which must substantially reduce the bit overhead to permit a high data throughput while still allowing for the highest accuracy possible, i.e. intercommunication integrity. In such a communication system, erratic or faulty transmissions could result in catastrophic failure in either of the communicating processing units. Further, such a communication system does not permit for absolute synchronous data transmission since the nature of the system installation is that of remotely located or detachable processing units where the use of separate clock lines between the units is impractical and sometimes impossible. Therefore, the protocol must ensure low overhead to allow for the highest throughput rates, error control to ensure the highest accuracy to avoid any catastrophic failures, and provide timing for the precise exchange of digital signal information between processing units, regardless of the data bit rate of transmission, whether it be constant or variable.

SUMMARY OF THE INVENTION

In accordance with the present invention a communication system and method is provided having a communication link protocol between processing units which provides accurate timing, error detection, message receipt acknowledgment and variable data bit rate of digital signal information exchanged between the processing units.

Two processing units, one designated a master and the other a slave, are communicatively coupled via a data channel for remote communication. The master and slave both function as sending and receiving units, with the master in constant control of the system. Communication between the master and slave is in digital data bit format. The data format consists of a clock bit, transmitted by the master, followed by a data bit transmitted by a sending unit (either the master or slave). A message, command, or data consists of a string of clock signal bits, each followed by a data bit designated an information item. When such a string is communicated between processing units, it is preferably grouped into bytes, or words, with the words generally having a greater number of data bits than a byte. A byte may consist of a single word, or several bytes may be grouped together to form a word or message. In any event, each word contains control bits to aid in error checking, such as valid parity and identification of the transmission and reception of a word.

In the operation of the invention, the master has complete control of the communication link by its generation of the clock bits. As such, the master has complete control over the data bit rate of information interchange between the master and the slave. The master can vary the data bit rate without any adverse effects on the system, while maintaining accurate timing, error detection and acknowledgment of transmission and reception of digital signal information at the master and the slave.

Each word communicated (ie. by the master or slave) contains at least one binary bit of a prescribed binary state which is utilized by the receiving processing unit for end of message detection, for parity check and for effecting the generation of an acknowledgment signal back to the sending processing unit as an indication that a valid or invalid word has been received. The acknowledgment signal is utilized by the processing units (master and slave) to rapidly detect errors in the data being communicated to thus avoid catastrophic failures in the system and to ensure a communication link protocol of high integrity.

Processor and control means in the master and the slave, in response to the bit clock signals generated by the master, precisely control, on a synchrononized bit by bit basis, the digital signal information being exchanged over the communication link. It is this precise control which enhances the integrity of the communication link protocol of the invention by the rapid detection of message or word errors by the receiving unit and the notification thereby of any such errors to the sending unit.

In view of the foregoing, it is therefore an object of the present invention to provide a line protocol for a communication system and method therefore having enhanced operating characteristics.

It is another object of the present invention to provide a communication system having remotely coupled master and slave units wherein the timing of all information transfer between the master and slave is controlled by the master.

It is a still further object of the present invention to provide a method and communication link protocol for the precise control of the exchange of digital signal information between processing units of a communication system.

A further object of the present invention is to provide a communication system having communicatively coupled master and slave processing units and a communication link protocol therefore, where the master and slave each function as sending and receiving units with the master in timing control, to precisely control on a bit by bit basis the transfer of digital signal information between the master and slave units.

Yet another object of the present invention is to provide a method of bi-directionally communicating digital signal information in a prescribed protocol between a master processing unit and a slave processing unit wherein the digital signal information includes control information recognizable by the master and the slave for the rapid detection of an error in the digital signal information and the acknowledgment of the detection of such error.

BRIEF DESCRIPTION OF THE DRAWING

Other objects, features and advantages of the present invention, will become more fully apparent from the following detailed description of the preferred embodiment, the appended claims and accompanying drawing in which:

DESCRIPTION OF THE DRAWING

Figure 3A:
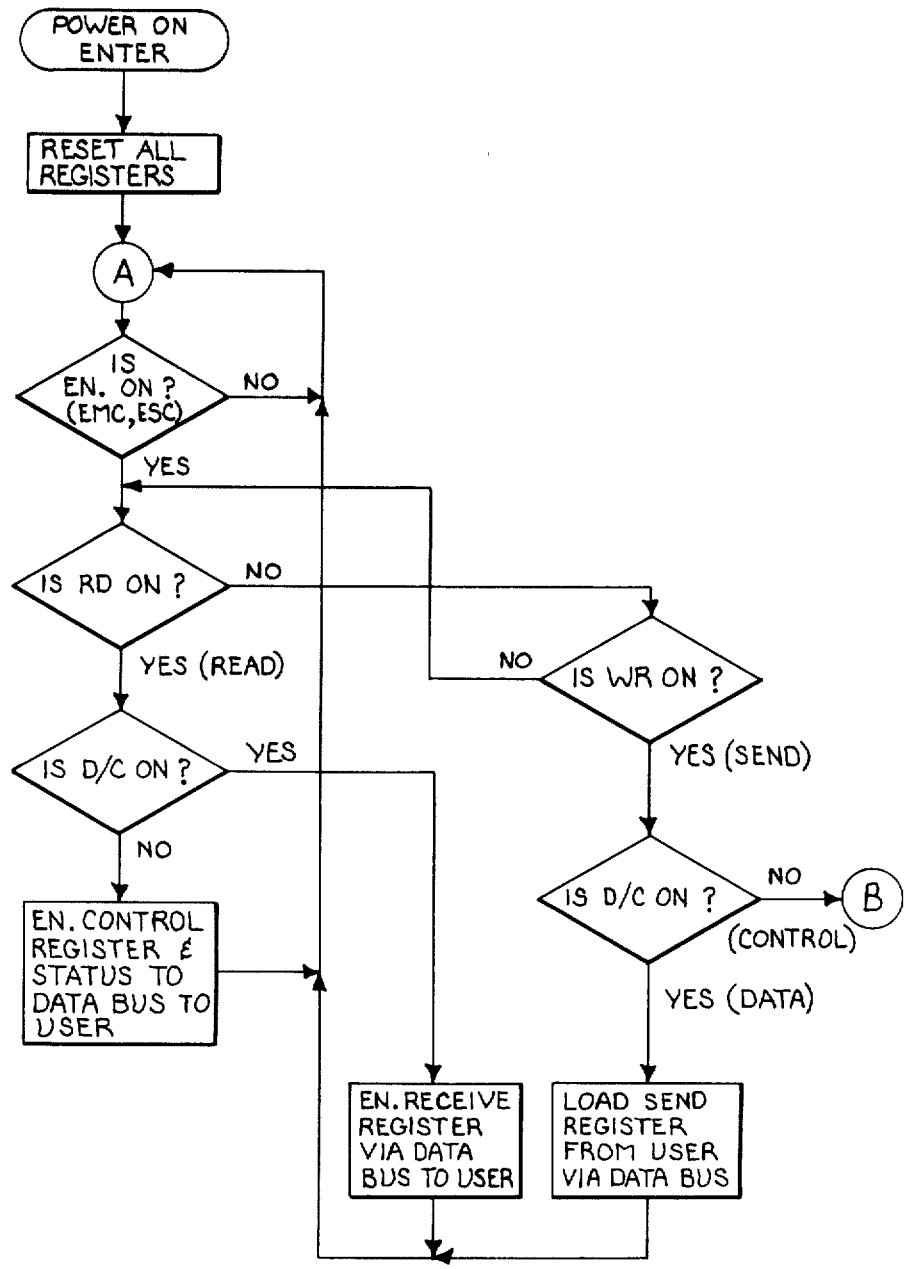
Figure 3B:
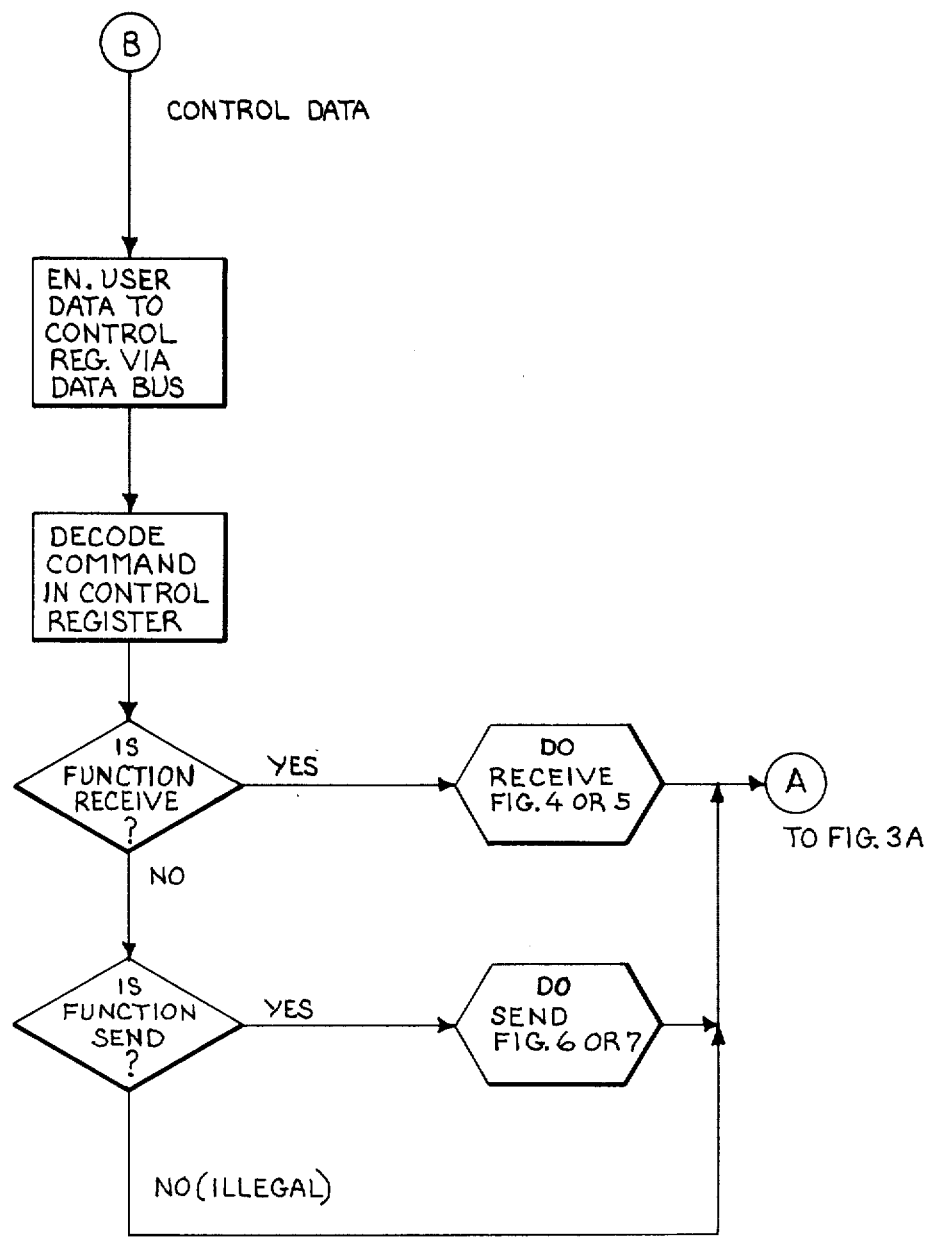
Figure 4A:
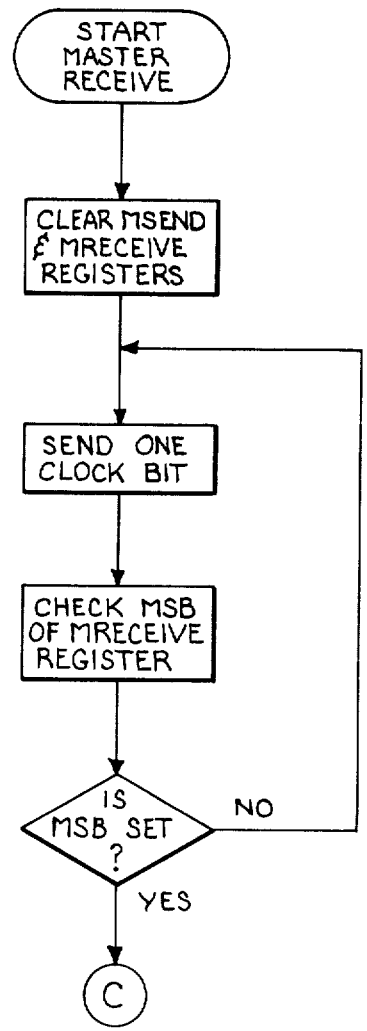
Figure 4B:
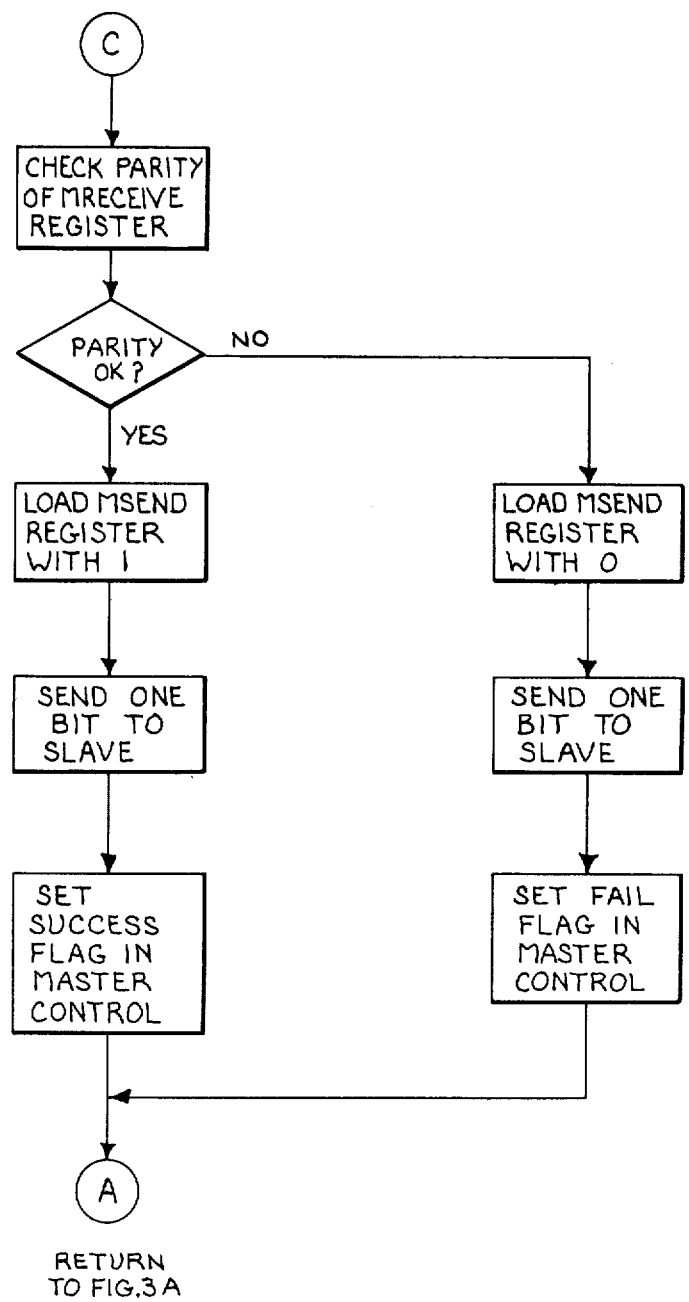
Figure 5A:
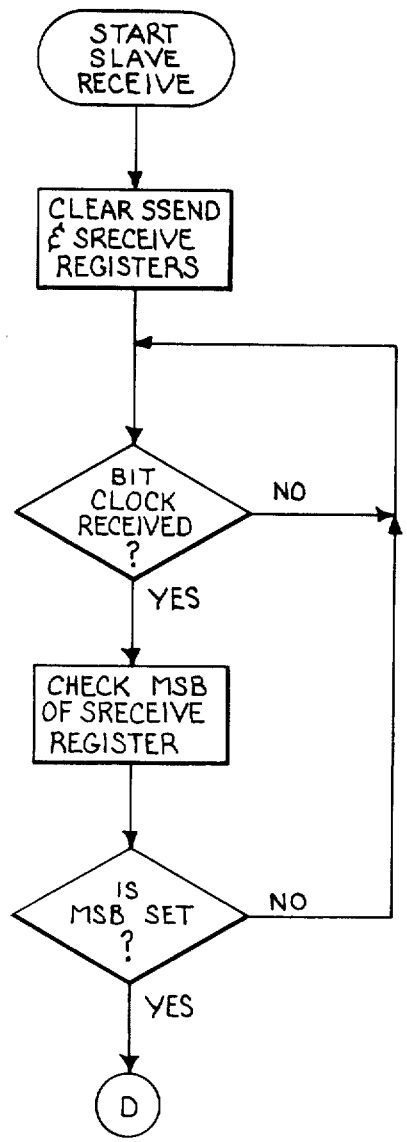
Figure 5B:
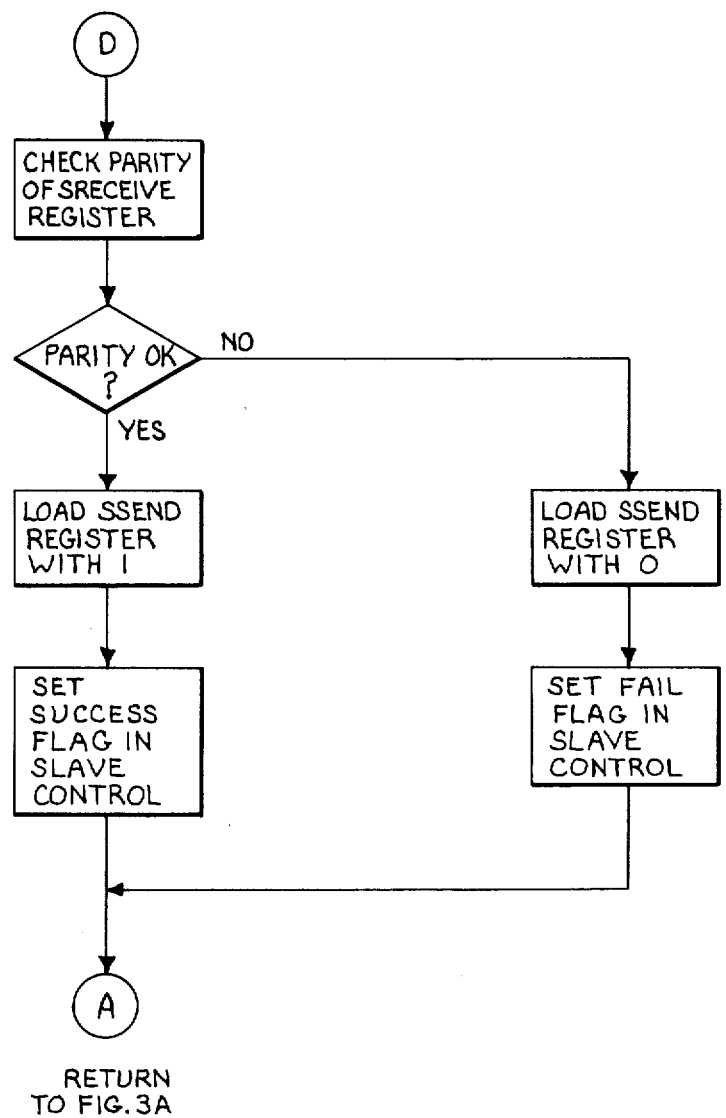
Figure 6A:
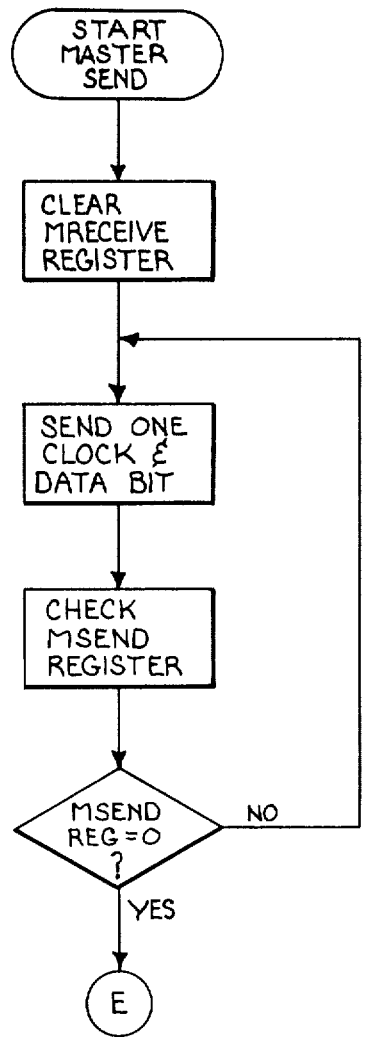
Figure 6B:
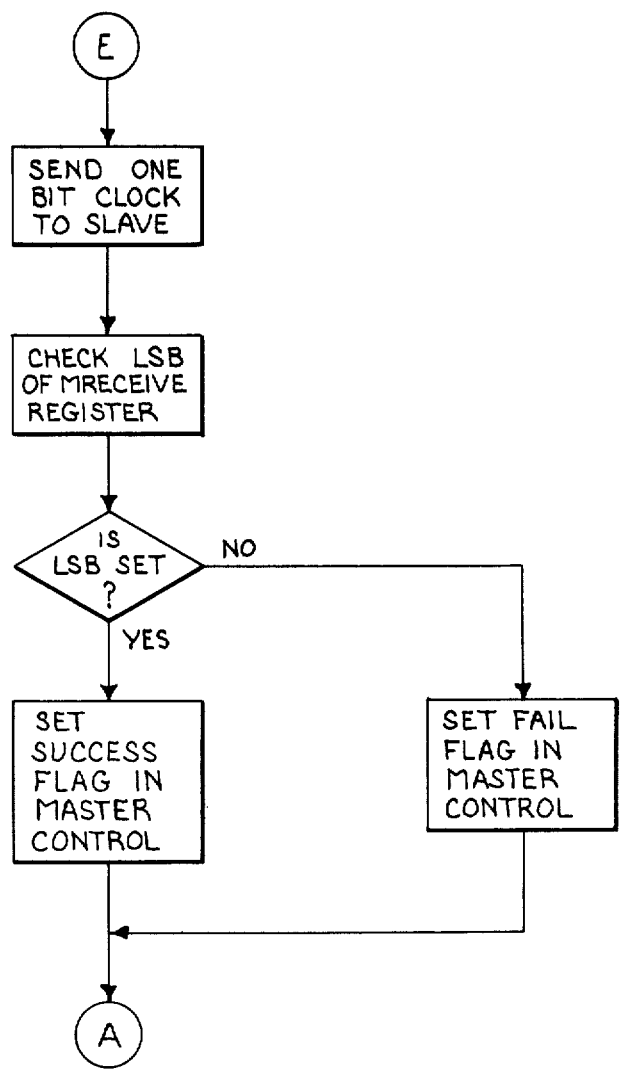
Figure 7A:
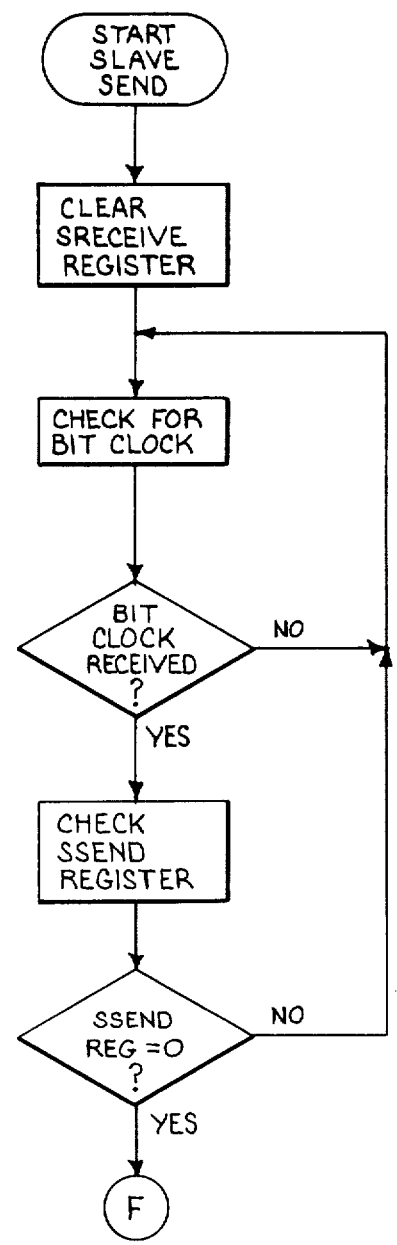
Figure 7B:
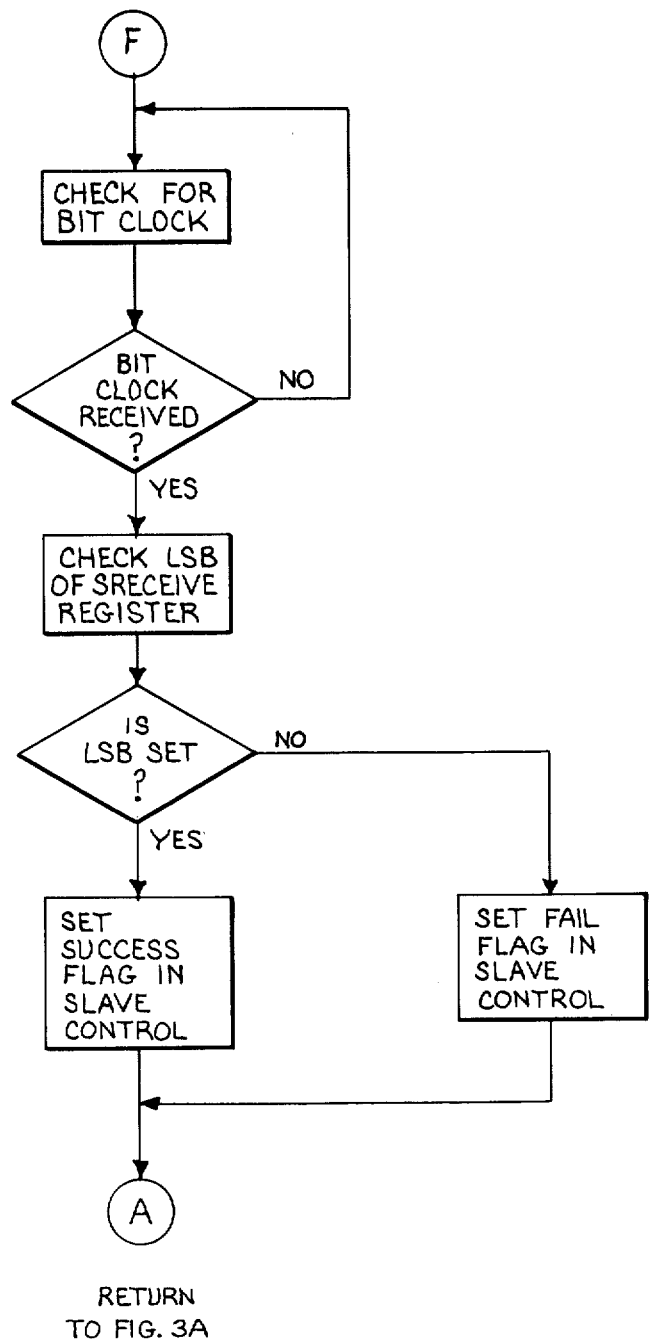
Figure 8:
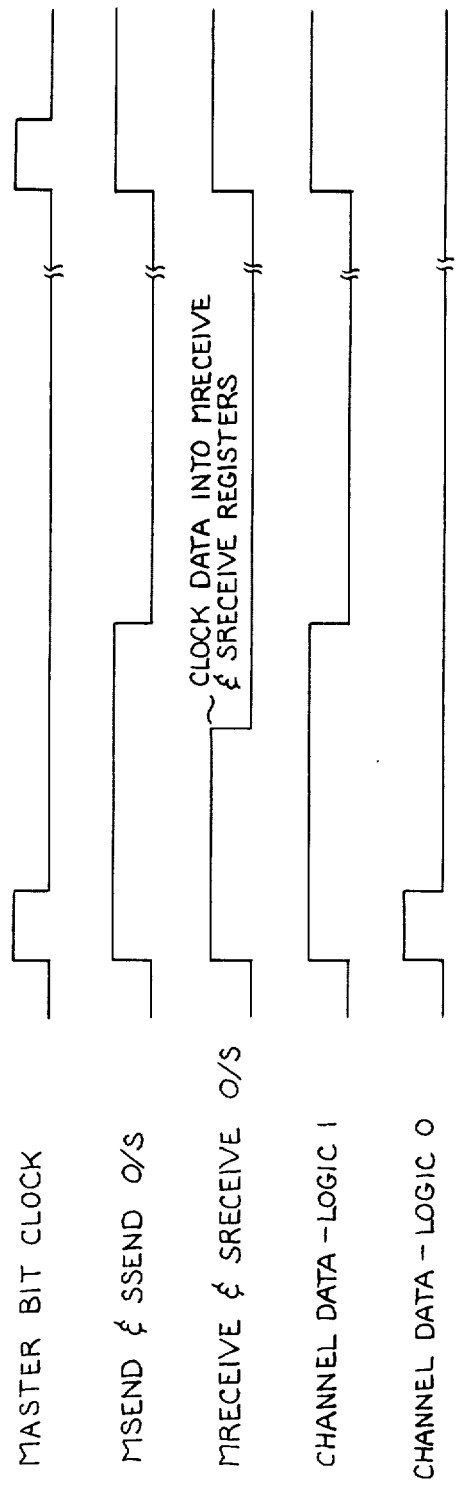

FIGS. 1 and 2 are schematic block diagrams of a master processing unit and a slave processing unit, respectively, and collectively represent a communication system in accordance with the present invention;

FIG. 3 (FIGS. 3A and 3B) is a master flow diagram individually used by both the master processing unit and the slave processing unit and is useful in understanding the apparatus and the method steps of operation of each of those units and the system of the present invention;

FIG. 4 (FIGS. 4A and 4B) is a flow diagram illustrating the operation of the master processing unit when performing a receive function;

FIG. 5 (FIGS. 5A and 5B) is a flow diagram illustrating the operation of the slave processing unit when performing a receive function;

FIG. 6 (FIGS. 6A and 6B) is a flow diagram illustrating the operation of the master processing unit when performing a send function;

FIG. 7 (FIGS. 7A and 7B) is a flow diagram illustrating the operation of the slave processing unit when performing a send function; and FIG. 8 is a timing diagram showing the timing relationships of the key signals generated and received by the master and slave processing units during the sending and receiving of information over a data channel.

DESCRIPTION OF THE PREFERRED EMBODIMENT

Reference is now made to FIGS. 1 and 2 where there is shown, collectively, a communication system generally designated 10, comprised of a master processing unit 12 and a slave processing unit 14 communicatively coupled via a data channel 16.

The communication link (ie. data channel 16) between the master 12 and the slave 14 can be established through any number of well known techniques. For example, where remote communications are desired, data channel 16 can be by RF Carrier. On the other hand, if the application permits, the data channel 16 may comprise a coupling such as magnetic, light or hard wired. Regardless of the type of communication coupling or linking used, it is to be understood that all information exchanged between the master 12 and slave 14 is in serialized digital signal format. That is, all information transferred over the data channel 16 is in the form of pulses having binary states (ie. "1" or "0"), the combination and the states thereof representing data, such as messages, commands or information items to be operated on or processed.

Reference is now made to the master 12 of FIG. 1. As can be seen, the constituent parts or elements making up the structure of the master are conventional logic elements and devices well known to those skilled in the art of digital logic and circuit design. To that end, the master 12 is comprised of a master user 18, such as a conventional microprocessor, a master receive one-shot 20, a master send one-shot 22, a master send shift register 24, a master receive shift register 26, a bit clock one-shot 28, an AND-gate 30, an OR-gate 32, and a master control 34. As will become evident in the ensuing description, the master control 34 can be implemented with conventional discrete logic elements, standard microprocessors such as an RCA 1802, or it can be a state logic machine or device.

The master user 18 is an independent microprocessor which can be programmed to perform any desired function. The master user may also be an RCA 1802 microprocessor or the like. In the preferred embodiment, the master user 18 is a programmable multiple rate kilowatt-hour meter for use in monitoring electrical energy at consumer and business locations. The meter is also remotely readable. Such a meter is inaccessibly enclosed within a housing. As such, some means must be provided to remotely program the meter (master user 18) and to read out customer billing information. In the preferred embodiment, that means is provided by the slave 14 which comprises a microprocessor based manually operable meter reader/programmer device for communicating with the master 12, via the communication link 16. A meter for performing the above types of functions is disclosed in U.S. patent application Ser. No. 238,450, filed on Feb. 26, 1981, entitled "Method and Apparatus for Multiple Rate Metering Energy", assigned to the assignee of the present invention.

A programmable meter (master user 18) of the above mentioned type operates continuously to perform many important functions, such as monitoring of power consumption, calculation of peak and demand power consumption at prescribed intervals, operation of loads, etc. The performance and completion of these functions takes precedence over all external communications with the meter. That is, the meter (master user 18) is programmed to give precedence to the performance of its internal functions, and will communicate externally with the programmer/reader (slave 14) only when it has time to do so. With that precedence established, the the master user 18 operates completely independently and asynchronously of the other constituent elements of the master 12. That is, the master user 18 will signal the master control 34 when it desires to perform an information transfer between the master 12 and the slave 14, or perform some function internal to the master 12.

With the preceding description of the master user 18 in mind, reference is now made to an enable master control (EMC) signal line from the master user 18 to the control 34. The EMC signal is generated by the master user 12 when power is first applied to the master 12, or at selected times during the operation of the master user 18 to signal the master control 34 that the user 18 desires to perform a function.

A function is broken down into basically two classes: (1) requesting previously stored data from the MRECEIVE register 26; or (2) sending data or control information from the master user 18 to the slave 14 via the data channel 16. The class is determined by the state of three signals, RD (read), WR (write) and D/C (data or control) provided to the master control 34 from the master user 18. If the function is of the first class (RD enabled) and the D/C signal is disabled (i.e. logic 0), the the master control 34 provides an enable receive register (ERRG) signal to the Mreceive register 26. The ERRG signal enables the register 26 to a bi-directional data bus 36 and the contents of the register 26 are read by and stored in the master user 18.

If the function is of the second class (WR enabled), as specified by the master user 18, then the state of the data/control (D/C) signal from the user 18 specifies to the control 34 which one of the following sub-functions is to be performed:

1. If the D/C signal is enabled (ie. logic 1), then the master control 34 generates a load signal on line 38, enabling the MSEND register 24 and loading a data word from the master user 18 into the register 24 via the data bus 36. The MRECEIVE register 26 is also reset via a clear signal on line 40 from the master control 34.

2. If the D/C signal is not enabled (ie. logic 0), then a control word is loaded into a control register (not shown) in the master control 34 from the master user 18 via the data bus 36. This control word is instantly decoded in a conventional manner in the master control 34 where the results of that decode specify whether the sub-function is to enable the master 12 to read digital signal information from the slave 14 or to send such information to the slave.

If data is to be sent to the slave 14, the MSEND register will have been previously loaded from the master user 18 as described in the preceding paragraph 1. The MRECEIVE register 26 is also reset via the clear signal line 40 as previously described. On the other hand, if the master control 34 decode specifies that digital signal information is to be received from the slave 14, the master control 34 resets the MReceive and MSend registers simultaneously via the clear lines 40 and 42 respectively, in preparation to receiving that information.

Once the master user 18 disables or lowers its EMC signal line, the master control will then operate independently of the master user 18 to either send data to or receive data from the slave 14. The manner and method in which these send and receive operations are carried out by the master 12 will subsequently be described.

The master user 18 can also interrogate the control register of the master control 34 via the data bus 36 and obtain status information as shown by a stat signal line from the control 34 to the user 18. When the user 18 desires to interrogate the master control 34, it enables the RD signal and disables the D/C signal. This combination of signals enables the master control to enable its control register to the data bus and also provide the status information to the master user 18.

Reference is now made to the slave 14 as shown in FIG. 2. It is readily discernible that the slave is quite similar in structure to the master 12 and contains conventional logic elements and circuits like those of the master 12. As a practical matter, about the only structural difference between the slave and the master is that the former does not contain a bit clock one-shot 28 or gates 30 and 32.

The slave 14 is comprised of a slave send one-shot 44, a slave receive one-shot 46, a slave receive shift register 48, a slave send shift register 50, a slave control 52, and a slave user 54. A bi-directional data bus 56 is also provided to interconnect the control 52, user 54 and registers 48 and 50 in a manner similar to bus 36 in the master 12. It will also be noted that the signal lines running between the slave user 54 and the slave control 52 carry similar nomenclature as that previously described for the master 12. Further, a load line 58, clear lines 60 and 62 and an enable slave receive register (ESRG) line are provided for controlling the send and receive registers in the same manner as described for the master 12.

The slave user 54 of FIG. 2 is considered a microprocessor, such as an INTEL 8085, and contains its own program for communicating with the slave control 52. The slave control 52 may be constructed similar to the master control 34. To cause the slave user 54 to carry out various operations, such as read or write to the data bus 56, or to cause the slave 14 to send or receive digital signal information, a plurality of action control switches 64 are provided. As previously mentioned, the slave 14 in the preferred embodiment, is a microprocessor based meter programmer/reader apparatus. To that end, the selective activation of the various switches 64 will provide interrupt or input control signals to the slave user 54, directing the latter (via its program) to perform a function or functions as specified by the particular switch or switches.

To understand the operation of the invention, it is significant to point out a certain operational characteristic of the invention. That is, (1) at initial system start-up, or (2) at end of any data exchange between the master and slave, or (3) upon the detection of any error in the data being exchanged, the master 12 becomes the "listener" and the slave 14 becomes the "talker". Stated another way, upon the occurrence of either (1), (2), or (3), the master 12 will revert to a receive mode pending the receipt of a command or message from the slave 14.

As previously mentioned, the master 12 has complete control of all system communications. This includes, inter alia, control of the data bit rate of transmission and control of when an information exchange is to take place between the master and the slave. With the preceding in mind, the operation of the invention will now be described by initially referring to FIGS. 1, 2 and 3.

FIG. 3 is a flow chart of a main control sequence common to the master and slave, and showing the operation of the master control 34 and the slave control 52.

In other words, each control (34 and 52) operates substantially in the same manner. Thus, only one flow chart is presented. The only difference between the operation of each main control (ie.), master control 34 and slave control 52) is the manner in which they sequence to control the transfer of information over the communication link 16. In other words, one control will control the sending of digital signal information, while the other control is controlling the receiving of information.

Reference is now made to FIG. 3A in conjunction with FIGS. 1 and 2. Let it now be assumed that power has just been applied to both the master 12 and slave 14. As soon as power is turned on, a reset signal (not shown) is generated resetting all of the registers in the master and slave.

Each control (34 and 52) monitors its corresponding enable signal (EMC and ESC) from its associated user (18 and 54) to see if that enable signal is on. As shown in FIG. 3A, if the enable is not on the processing unit (master 12 or slave 14) will loop in an idle mode, taking no action.

Let it now be assumed that an operator at the slave 14 activates one of the action switches 64 providing an input signal to the slave user 54, causing the latter to enable the ESC signal. As shown in FIG. 3A, the slave control 52 now tests to see if the RD signal is on. It will be recalled that the slave 14 always becomes the talker at power on. Therefore, the RD signal is not on.

Since RD is not on, the control 52 next tests to see if the WR signal is on. If it is not, the control 52 will idle in a no action loop until such time that the user 54 turns on WR, signifying that data is to be sent to the master 12.

When the slave user 54 turns on the WR signal, the control 52 tests to see if the D/C signal is on. In the present instance, since data is to be sent to the master, the D/C signal will be on. In response to the preceding logic conditions, the slave control 52 now generates the load signal on line 58, loading the data to be sent from the user 54 into the SSEND register 50 via the data bus 56.

As soon as the SSEND register is loaded, the control 52 will now go back to connector A and cycle through the path just described until the slave operator takes a subsequent action to cause the data to be sent to the master.

Let it now be assumed that the slave operator activates one of the switches 64 which directs the slave user 54 to turn off the D/C signal. As can be seen in FIG. 3A, the slave control now enters a connector B of FIG. 3B.

In FIG. 3B, the slave control 52, under the direction of the slave user 54, makes a determination as to whether the slave 14 is to perform a send or receive function. This determination is made by the control 52, by it reading a command from the user 54 and storing that command in an internal control register not shown. This command of course comes over the data bus 56.

As soon as the command is loaded into the control register, a conventional decode (not shown) in the slave control 52 decodes the command to determine if the function to be performed is a send or receive. As shown in FIG. 3B, this decode will yield either a function receive or function send. The control also decodes for an illegal function code. If such an illegal code is detected, the control 52 will return to connector A of FIG. 3A and no further action will take place until directed to do so by the slave user 54.

In the present discussion it is still assumed that the slave 12 is going to send data to the master 12. As a result, the control 52, from the "is function send?" decision block will enter a slave send routine as shown in FIG. 7.

At this time, prior to proceeding with a discussion of how the slave 14 sends the data from its SSEND register to the master 12, it is believed advantageous to explain how the master control 34 of the master is set up to control the sending of data and its receiving of same. For that explanation, reference is now made back to FIGS. 1 and 3A.

It was previously mentioned that the master user 18 of FIG. 1 is an asynchronous processor. As such, that processor will not turn on its enable line EMC to the master control 34 until such time that it desires to signify to the master 12 that it intends to perform a function. Let it now be assumed that the master user 18 temporarily interrupts its normal processing routines and turns on its enable signal EMC to the master control 34. As shown in FIG. 3A, the enable signal EMC being on causes the master control 34 to test to see if the RD signal is on coming from the master user. In this particular instance, since the master is going to function as a receive unit the RD signal is not on, therefore the master control 34 next tests to see if its WR signal coming from the master user is on. The WR signal will be on in this particular instance, thus the master control 34 tests to see if the D/C signal line is on coming from the master user 18. The D/C signal will not be on at this time, thus the master control 34 will enter into connector B of FIG. 3B. In this particular instance, the master control 34 will enable the data bus 36 from the master user 18 to thus store, in the master control data register, a command which will specify a receive function is to be performed. This command of course, will be decoded by the internal decode in the master control 34, and when tested by the master control it will be decoded as a function receive command as shown in FIG. 3B. The master control will now exit the yes branch of the "is function received?" decision block and enter into a master receive flow chart as shown in FIG. 4A.

The master control 34 in FIG. 4A first sends a clear signal via lines 40 and 42 to reset each of the registers 26 and 24. These registers are cleared in preparation for the master to receive the data previously loaded into the SSEND register 50 of the slave 14.

It is previously mentioned that the master 12 has complete control over the exchange of all data flowing between itself and the slave 14. This is accomplished by the master 12 controlling the data bit rate of transmission between the master and the slave by the generation of a master bit clock signal MBCLK from a clock source shown as the bit clock one-shot 28 in FIG. 1. The bit clock one-shot 28 is fired by a clock signal CLK generated by the master control 34. The master control 34 has a conventional oscillator which is switch controlled by logic conditions within the master control 34 to enable the CLK signal to trigger the bit clock one-shot 28. The master control 34 enables the CLK signal any time a receive or send function is to be performed by the master 12. Thus, at this time, as shown in FIG. 4A, the master control will generate a CLK signal to trigger the bit clock one-shot 28. The firing of the bit clock one-shot 28 will generate an MBCLK signal which is sent through the communication interface 16 to the slave 14 via the ORgate 32. Reference is made to FIG. 8, which shows a timing diagram illustrating the generation of the MBCLK or master bit clock signal and the various other signals generated by the key constituent elements of the master and the slave in response to the MBCLK signal. The timing diagram of FIG. 8 is common to the operation of both the master 12 and the slave 14. The operation of that timing diagram will become clear in the ensuing description.

As shown in FIG. 4A, the master transmits or sends one clock bit by the firing of the bit clock one-shot 28. It should also be noted that the MSEND and MRECEIVE one-shots 22 and 20 respectively are both fired on the leading edge of the MBCLK signal. The output of the MSEND one-shot 22 is applied as one input to the ANDgate 30, also receiving at its other input the output of the MSEND shift register 24. Since the MSEND register 24 was previously cleared, its output will be zero, thus having no affect on the output of ANDgate 30 or the output of ORgate 32. In other words the ORgate 32 is continuously generating logic zero output data pulses as shown in FIG. 8, where each logic zero pulse, in fact, is the same pulse as the MBCLK pulse.

Let it be assumed at this time, for each MBCLK pulse transmitted to the slave 14, that the slave instantaneously responds back with a data bit to the master 12. The length of this data pulse as shown in FIG. 8 as the channel data logic 1 pulse. This input pulse is provided to the input of the MRECEIVE register 26 via conductor 64. As shown in FIG. 8, this data pulse is clocked in to the MRECEIVE register 26 by the negative falling edge of the MRECEIVE one-shot 20 in the master 12. As soon as the data bit is clocked into the MRECEIVE shift register 26, the master control 34 then enables the ERRG line to the MRECEIVE register, whereby the master control 34 reads the contents of that register via the data bus 36 and checks the most significant bit (MSB) of the MRECEIVE register. If the most significant bit, as shown in the "is MSB set?" decision block, is not set the master control will loop back to the input of the send 1 clock bit action block. The master 12 will continue to generate MBCLK pulses to the slave 14 by operating in the just described loop until the most significant bit of the MRECEIVE register 26 is set equal to a 1.

At this time, it is significant to point out that one of the stipulated criteria of the present invention is that any data which is loaded into a SEND shift register of either the slave 14 or the master 12 for transmission across the data channel 16 must contain a binary 1 in the first bit position of the message. It is the reception of this binary 1 in the most significant bit position of the MRECEIVE register 26 which identifies to the master 12 that the data or complete message word has been received.

Let it now be assumed that the entire data word from the slave 14 has been received in the MRECEIVE register 26. As a result, the most significant bit is set and the control 34 will now enter into connector C of FIG. 4B. The first operation performed by the master control 34 in FIG. 4B is to check the parity of the data in the MRECEIVE register 26. This is accomplished, of course, by the master control again reading the contents of the MRECEIVE register 26 because the ERRG signal is still enabled. Let it be assumed that the master control 34 detects that the message does contain correct parity. As a result, it will exit through the YES branch of of a "parity OK" decision block, wherein the master control will send a load signal 30 on line 38 to the MSEND shift register 24 and transfer a binary 1 into the most significant bit position of that register via the data bus 36. The master control will now generate one more CLK signal firing the bit clock one-shot 28 which triggers the MSEND shift register 24 sending that binary 1 signal to ANDgate 30 in conjunction with the output of the MSEND one-shot 22 to provide a binary 1 acknowledgment signal back to the slave 14 indicating to the slave that the message has been received by the master with good parity. The master control will then immediately set a success flag internal to the master control to provide a good parity status condition via the STAT line to the master user 18. The master user 18 can use the state of the STAT signal as an indication that the entire message transfer was valid or invalid for controlling its own internal operations. The master control 34 will now return to connector A back to FIG. 3A for re-entry into the main control sequence as previously described.

Having described the receive operation of the master 12, it is now possible to refer to FIG. 7A for an understanding of how the slave 14 transmits the data which is presently stored in its SSEND register 50. Reference should also be made to the timing diagram of FIG. 8 to understand this operation. As shown in FIG. 7A, as soon as the slave 14 goes into the SEND function mode, it begins to test for the presence of a bit clock from the master 12. As shown in FIG. 8 and FIG. 2, the SRECEIVE one-shot 46 is fired each time a master bit clock signal MBCLK is received by the slave 14. It is the output of the SRECEIVE one-shot on conductor 66 that the slave control 52 tests to determine for the presence of the bit clock. As shown in FIG. 7A, if the bit clock is not received the slave control will idle until a clock is received to fire the SRECEIVE one-shot 46. Upon receipt of the bit clock from the master 12, the slave control now enables its ESRG signal line to the SSEND register 50. This signal enables the output of the SSEND register 50 on to the data bus 56, where it is now read by the slave control 52 to test to see if the contents of the SSEND register are equal to 0. If the contents of the SSEND register are not 0, the slave control will continue to loop back checking for additional bit clock signals until the entire data is shifted out of the SEND register 50. The slave determines that the entire data has been shifted out of the SSEND shift register 50 when the contents of that register are equal to 0. One way of making this determination would be to establish the criteria that, for every data word placed in the SSEND register, the least significant or last bit of that register be a binary 1. Thus, when the last bit is shifted out of the SSEND register, it will contain all zero's indicating to the slave control that the entire data word has been transferred.

Let if now be assumed that the data word has been transferred from the slave 14 to the master control, thus the slave control 52 will enter into a connector F of FIG. 7B, wherein the first action to take place is to again check for the presence of a bit clock in the manner as previously described. The slave control 52 will idle until a bit clock is received, at which time it will now generate the ERRG signal to the SRECEIVE shift register 48. This of course, enables the output of that register to the data bus 56, where the slave control 52 tests to see if the least significant bit of the SRECEIVE register is equal to 0. The slave control 52 is testing at this time to see if the master 12 has responded with the previously described acknowledgment signal. If that signal is present, as indicated by the least significant bit of the SRECEIVE register, the slave control 52 will set an internal success flag providing a signal on the STAT line to the slave user 54 for its use in controlling its operations. In a similar fashion, if the least significant bit is not set, indicating that a valid message was not received by the master 12, the slave control 52 will set a fail flag in the slave control, sending an invalid status receive message signal via the STAT line to the slave user. Upon completion of the set success or fail flags, the slave control 52 will return back to the connector A of FIG. 3A in the manner as previously described.

Reference is now made back to FIGS. 1 and 3A. Let it now be assumed, that a data word from the slave 14 is contained in the MRECEIVE register 26. Under normal operating conditions the master 12 will interrogate or read the MRECEIVE register 26 in order to determine what further action it is to take. This is accomplished in FIG. 3A as shown by the master user 18 enabling the EMC, RD and D/C signals to the master control 34. With these conditions met, the master control 34 will turn on the ERRG signal to the MRECEIVE register 26, enabling its output to the bus 36 where its contents are read and stored by the master user 18. The master user, by examining the contents of this data word, can now make a determination as to what future action it is to take in directing the master control 34. Upon the reading of the data word from the receive register 26, the master control will now loop back to connector A, where it will continue to examine the output signals from the master user 18 to determine what action it is to take. One of these actions may be, for example, to read the contents of the control register and the status information via the data bus 36 and the STAT line to find out what the previous command was to the master control. This is accomplished as shown in FIG. 3A by the master user 18 disabling the D/C line and enabling the control register and the status line to the master user where that information can be read and stored by the master user 18. After this operation, the master control will then revert back to the A connector of FIG. 3A.

Based on the contents of the MRECEIVE register 26, the master may also be directed to send a data word to the slave 14 or to receive another word therefrom. Let it be assumed that the master user, after interrogating the contents of the MRECEIVE register 26, makes a determination that data is to be sent to the slave unit 14. As shown in FIG. 3A, under this condition the master user 18 will disable the RD signal and turn on the WR signal to the master control 34. The master user 18 will also enable the D/C signal in order to put data into the MSEND register 24. This is accomplished, of course, by the master control generating a load signal on conductor 38 to transfer the data from the master user 18 into the MSEND register 24 via the data bus 36. The master control will now loop back to connector A in a manner as previously described.

Since data is to be sent from the master to the slave, the master user 18 will leave the EMC, RD and WR signals enabled and now disable the D/C signal. The disablement of the D/C signal, as shown in FIG. 3A, causes the master control to go to connector B of FIG. 3B. In FIG. 3B, the master user will now load a send function command into the master control 34 in the manner as previously described. Upon the decode of that command by the master control, the master control will now exit the YES branch of the send function decision block and enter into a master send routine as shown in FIGS. 6A and 6B.

Reference is now made to FIG. 6A in conjunction with FIG. 1. Upon entry into FIG. 6A, the master control 34 will first generate a clear signal on conductor 40 to reset the MRECEIVE register 26. The MRECEIVE register 26 is reset at this time in preparation to receiving an acknowledgment signal from the slave 14 after the termination of the transmission of the data from the master to the slave 14. The master control will now enable the CLK signal in the manner as previously described to begin sending out bit clock signals from the one-shot 28. As shown in FIG. 6A and in the timing diagram of FIG. 8, every time a bit clock signal is sent the MSEND register 24 is also shifted one bit, to thus transmit to the slave, one data bit preceded by a clock pulse.

The master control next checks the contents of the MSEND register 24 in the same manner as the slave checks the SSEND register to see if the contents of that register are zero. If the register is not zero, the master control continues to loop, transmitting out clock and data bits in the manner as just described. When the last data bit has been transmitted, the MSEND register will be zero and the master control 34 will enter into connector E of FIG. 6B. In FIG. 6B, the master control will then generate one more CLK signal, firing the bit clock one-shot 28 to send one more clock bit to the slave. The slave will now respond back over the data channel 16 to the MRECEIVE register with an acknowledgment bit. That bit is clocked into the MRECEIVE register on the falling edge of the MRECEIVE one-shot output signal as shown in FIG. 8 and FIG. 1. The master control will now enable the ERRG line to test the least significant bit of the MRECEIVE register 26 to see if a valid transmission took place.

As shown in FIG. 6B, if the least significant bit is set, the master control will then set its internal success flag for interrogation by the master user 18. If the least significant bit is not set, the master control will set a fail flag for interrogation by the master user 18. The master control 34 will now return back to connector A of FIG. 3A in a manner as previously described.

Let it now be assumed that the slave 14 has just transmitted a command to the master 12 and that it expects a response to that command from the master 12. In order to receive data from the master 12, the slave 14 must be placed into the receive mode. This could be accomplished, for example, in FIG. 2 by the operator of the slave activating one of the switches 64 which would provide an input signal to the slave user 54 causing it to generate the necessary output signals to the slave control to put the slave into the receive function mode. As shown in FIG. 3A, in order to go into the receive mode, the slave user 54 would enable the ESC line, disable the RD line, enable the WR line and disable the D/C line, causing the slave control to enter into connector B of FIG. 3B. In the manner as previously described, the slave control 52 will now be enabled to read and decode a receive function command which causes the slave control to exit the yes branch of the "is function receive?" decision block entering into a slave receive routine as shown in FIGS. 5A and 5B.

Referring to FIG. 5A, the slave control first sends clear signals to the SSEND and SRECEIVE registers 50 and 48 via lines 62 and 60 respectively to thus reset those registers. The slave control 52 now monitors the output of the SRECEIVE one-shot on conductor 66, waiting for the receipt of a bit clock signal MBCLK from the master 12. When a bit clock is received, the slave control now tests the most significant bit of the SRECEIVE register by enabling the ESRG line and reading the contents of that register via the data bus 56. At this time, the slave control is testing to see if the entire word has been received from the master. If the most significant bit is not set, the slave will continue to clock data bits into the SRECEIVE register 48 and testing that register for each bit received. When the most significant bit is set, the master control will now exit to a connector D of FIG. 5B, wherein the master control will check parity by reading the contents of the SRECEIVE register. This is accomplished by enabling the ERRG signal line. If the parity of the received information from the master 12 is valid, the slave control 52 will load a binary 1 into the least significant bit position of the SSEND register 50. This is done by enabling the ESRG line and transferring a binary 1 into the SSEND register via the data bus 56. The slave control 52 will then set a success flag internal to the control for monitoring by the slave user via the STAT line. If the parity check was not ok, the slave control will thus load a binary zero into the least significant bit of the SSEND register and set a fail flag. The slave control will now return back to connector A of FIG. 3A in a manner as previously described for subsequent operation.

From the preceding discussion and by reference to FIGS. 1 and 2, it can now be seen how the slave 14 is under complete control of the master 12. This is made clear by the fact that the slave 14 will not re-act in any way to either send or receive data over the data channel unless the master 12 is enabled to provide bit clock signals MBCLK to the slave 14. This is a very desirable feature in systems of the type contemplated by the present invention, where the master user 18 must perform many high priority tasks without being interrupted by an external device which has a need to communicate with the master 12. Thus, by using a master user and control such as 18 and 34 of FIG. 1, it is possible to perform send and receive functions to selectively control when information is to be synchronously transferred between the master and the slave by the mere control of the MBCLK signal at the master. The fact that the master user has direct control of the EMC signal to enable the master control and thus control the periodicity or the time of generation of the CLK signal to fire the bit clock one-shot 28, the master user and control 18 and 14 can thus control how many clock pulses are generated in any given time. The clock pulses can be generated consecutively if the master oscillator is left on in the master control or, they can be interspersed periodically, thus transferring bits of data at various discrete intervals. In this manner, it is possible for the master 12 to control the exchange of complete messages at one single time or to transmit only portions of messages, even to the extent of one bit at a time, with a hiatus between the bits of a message.

From the foregoing, it can now be seen how the present invention is a method of transferring digital signal information between a master processing unit and a slave processing unit, whereby each of the processing units functions as a transmitting and receiving unit. In the method steps of the invention, information items representative of a plurality of types of messages and data to be communicated and a program for directing the operation of each processing unit is stored in the processing and control means made up of the user and control in each unit. The master processing unit transmits a clock signal having a variable bit rate determined by the program of the master processing unit which is received at the slave processing unit. For each clock signal transmitted by the master processing unit, a transmitting unit receives that information in response to each of the clock signals. After a prescribed number of information items or data bits have been received at the receiving unit, an acknowledgment signal or code representative of the receipt of the prescribed number of information items is transmitted from the receiving unit back to the transmitting unit.

It will be apparent to those skilled in the art from the foregoing description of the present invention, that various improvements and modifications can be made in it without departing from the true scope of the invention. Accordingly, it is the intention to encompass within the scope of the appended claims the true limits and spirit of the invention.

What is claimed is:

1. A method of serially transferring digital signal information items, between a master processing unit and a slave processing unit, each functioning as a sending unit and a receiving unit, comprising the steps of:
   (a) sending, from said master processing unit and receiving at said slave processing unit, a clock signal having a predetermined bit rate;
   (b) sending from a sending unit and receiving at a receiving unit; a prescribed number of information items in bit serialized form, each information item being preceded by a clock signal, whereby the information items are sent and received at the bit rate of said clock signal; and
   (c) sending from the receiving unit and receiving at the sending unit, after the prescribed number of information items have been received at the receiving unit, an acknowledgment signal representative of the receipt of the prescribed number of information items.

2. The method in accordance with claim 1 wherein the acknowledgment signal is sent from the receiving unit and received at the sending unit in response to a final clock signal generated by said master processing unit, after the prescribed number of information items have been sent by the sending unit.

3. The method in accordance with claim 1, wherein the step of sending the acknowledgment signal includes the step of performing a parity check of the information items at the receiving unit and developing from that parity check one of two binary states for the acknowledgment signal, the binary state being further representative of a valid or invalid parity check.

4. The method in accordance with claim 3, further including the step of checking the binary state of the acknowledgment signal at the sending unit as verification of the receipt, by the receiving unit, of information items of correct or incorrect parity.

5. A method of serially transferring digital signal information, as information items, between a master processing unit and a slave processing unit, each functioning as a sending unit and a receiving unit, comprising the steps of:
   (a) storing in each of said master and slave processing units information items to be transferred, at least one of the information items being of a prescribed binary state;

(b) sending, from said master processing unit and receiving at said slave processing unit, a clock signal having a bit rate controlled by said master processing unit;

(c) sending, from a sending unit and receiving at a receiving unit, a prescribed number of information items, each information item being preceded by a clock signal, whereby the information items are sent and received at the bit rate of said clock signal;

(d) testing, at the receiving unit, each information item received for the presence of the at least one information item having the prescribed binary state; and (e) sending from the receiving unit and receiving at the sending unit, an acknowledgment signal, the acknowledgment signal being sent upon detection of the information item having the prescribed binary state as an acknowledgment to the sending unit that the prescribed number of information items have been received by the receiving unit.

6. The method in accordance with claim 5, wherein the step of sending the acknowledgment signal includes the step of performing a parity check of the information items at the receiving unit and developing from that parity check one of two binary states for the acknowledgment signal as a further acknowledgment to the sending unit that an error did or did not occur in the integrity of the information being conveyed by the information items.

7. The method in accordance with claim 5, wherein the step of sending and receiving the information items further includes the steps of checking, at the sending unit, each time an information item is sent to the receiving unit, to see if the prescribed number of information items have been sent, and utilizing the results of that checking in the step of sending the clock signal, sending a last clock signal to the receiving unit to effect the generation of the acknowledgment signal by the receiving unit and inhibit the further sending of information items by the sending unit.

8. A method of transferring digital signal information over a data channel between two processing units designated a master and a slave, each functioning as a sending unit and a receiving unit, comprising the steps of:

(a) formatting the digital signal information at the sending unit into a message of a prescribed number of binary bits, the first bit of the message being of a mandatory predetermined binary state;

(b) generating at said master a sequentially occurring bit clock signal for use by said master and said slave;

(c) transmitting from a sending unit and shifting into a register in a receiving unit the formatted message in bit serialized form, the bits of the message being transmitted and received at the bit rate of said bit clock signal;

(d) testing the register at the receiving unit, as each bit of the message is shifted into the register, for the presence of the first bit of the message by testing the binary state thereof; and (e) transmitting, from the receiving unit to the sending unit, an acknowledgment signal indicating receipt of the message upon detection of the presence of the first bit of the message, said acknowledgment signal being transmitted from the receiving unit and received at the sending unit in response to the first bit clock signal from said master following the detection of the first bit of the message at the receiving unit.

9. A method of transferring digital signal information over a data channel between two processing units designated a master and a slave, each functioning as a sending unit and a receiving unit, comprising the steps of:

(a) formatting the digital signal information in a send register at a sending unit, into a message of a prescribed number of binary bits the first and last bits of the message each being of a predetermined binary state;

(b) generating, at the master, a sequentially occurring bit clock signal for use as a timing signal by the master and the slave;

(c) sending from the send register of the sending unit and shifting into a receive register in a receiving unit the formatted message in bit serialized form, the bits of the message being sent and received at the bit rate of said bit clock signal;

(d) testing, simultaneously, the binary states of the last bit of the message in the send register and the first bit of the message in the receive register at the sending and receiving units respectively, as each bit of the message is transferred;

(e) repeating steps (c) and (d) until the entire message has been sent by the sending unit, as determined by the testing of the binary state of the last bit of the message by the sending unit;

(f) sending one clock signal from the master unit to the receiving unit, following the last bit of the message sent by the sending unit; and (g) sending, from the receiving unit and receiving at the sending unit, in response to the last sent clock signal, an acknowledgment signal indicating receipt of the message as determined by the testing of the binary state of the first bit of the message at the receiving unit.

10. In a system for exchanging digitial signal information, the combination comprising:

(a) a data channel for bi-directionally communicating digital signal information;

(b) first and second processing units communicatively coupled to opposite end of said data channel, one of said processing units being designated a master and the other processing unit a slave and each of said processing units functioning as a sending and a receiving unit, each of said processing units including, (1) processing and control means having stored therein, information items to be communicated over said data channel as digital signal information and a program for directing the operations thereof, including controlling the transfer of the information items over said data channel, and (2) means coupled to said data channel and said processing and control means, for selectively communicating digital signal information over said data channel in response to clock signals provided thereto by said data channel and control signals provided thereto by said processing and control means; and (c) a clock source in said master, said clock source being connected to the means coupled to said data channel and further connected to the processing and control means of said master for selectively sending the clock signal to said slave, over said data channel, at a bit rate controlled by the processing and control means of said master, whereby information items are transferred between sending and receiving units of the system at the bit rate of the clock signals, with a clock signal preceding each information item transferred.

* * * * *